(12) United States Patent
Hübner et al.

(10) Patent No.: US 6,762,611 B2
(45) Date of Patent: Jul. 13, 2004

(54) TEST CONFIGURATION AND TEST METHOD FOR TESTING A PLURALITY OF INTEGRATED CIRCUITS IN PARALLEL

(75) Inventors: Michael Hübner, Schönau (DE); Gunnar Krause, München (DE); Justus Kuhn, München (DE); Jochen Müller, München (DE); Peter Pöchmüller, Colchester, VT (US); Jürgen Weidenhöfer, München (DE)

(73) Assignee: Infineon Techologies AG, Munich (DE)

( * ) Notice: Subject to any disclaimer, the term of this patent is extended or adjusted under 35 U.S.C. 154(b) by 0 days.

(21) Appl. No.: 10/010,504

(22) Filed: Dec. 5, 2001

(65) Prior Publication Data

US 2002/0089341 A1 Jul. 11, 2002

(30) Foreign Application Priority Data

Dec. 5, 2000 (DE) .......................................... 100 60 438

(51) Int. Cl.[7] .......................... G01R 1/073; G01R 31/28
(52) U.S. Cl. ....................................... 324/754; 324/765
(58) Field of Search ................................. 324/754, 761, 324/762, 765

(56) References Cited

U.S. PATENT DOCUMENTS 4,585,991 A * 4/1986 Reid et al. .................. 324/757
5,070,297 A * 12/1991 Kwon et al. ................. 324/754
5,497,079 A * 3/1996 Yamada et al. ........... 324/158.1
5,929,651 A * 7/1999 Leas et al. ................... 324/765
6,064,213 A   5/2000 Khandros et al. ........... 324/754
6,205,654 B1 * 3/2001 Burns .......................... 29/830

FOREIGN PATENT DOCUMENTS

DE         198 26 314 A1    12/1998

* cited by examiner

*Primary Examiner*—Ernest Karlsen
(74) *Attorney, Agent, or Firm*—Laurence A. Greenberg; Werner H. Stemer; Ralph E. Locher

(57) ABSTRACT

A test configuration for testing a plurality of integrated circuits, in particular fast semiconductor memory modules located on a wafer, in parallel. The test configuration includes a carrier board for bringing up electrical signal lines belonging to a test system, contact-making needles for producing electrical connections with contact areas on the circuits to be tested, and a plurality of active modules that are arranged on the carrier board. The active modules are each assigned to one of the circuits to be tested in parallel, and are each case inserted into the signal path between the test system and the associated circuit to be tested. In a preferred embodiment, the active modules are arranged at least partly overlapping, based on a direction at right angles to the plane of the carrier board.

8 Claims, 4 Drawing Sheets

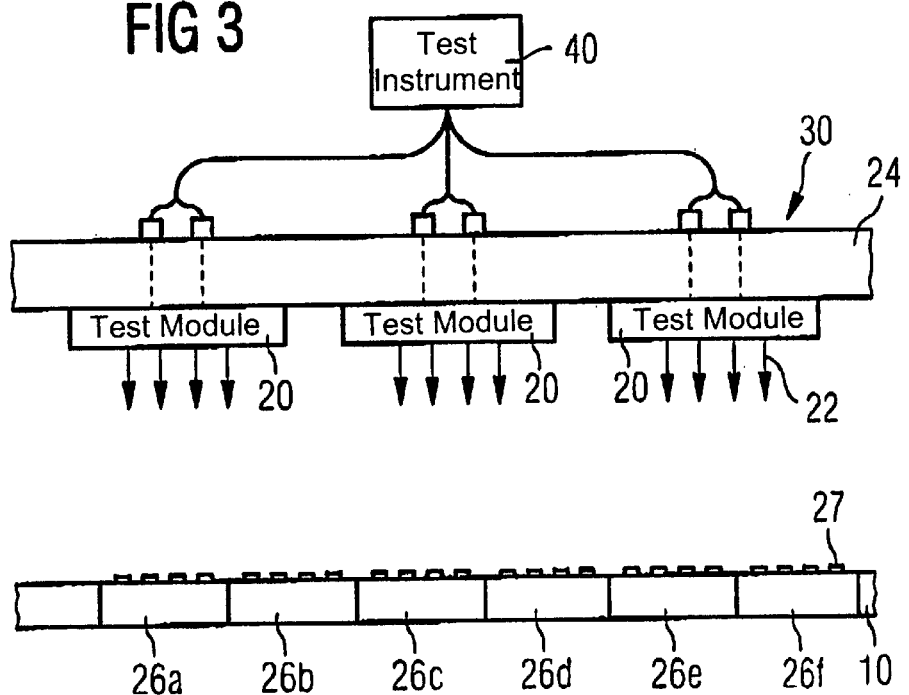
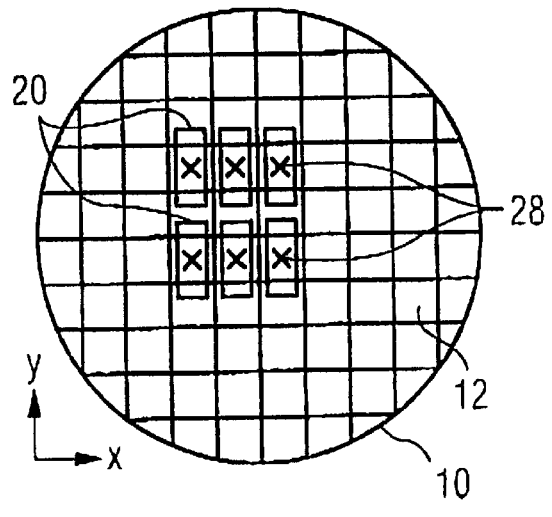
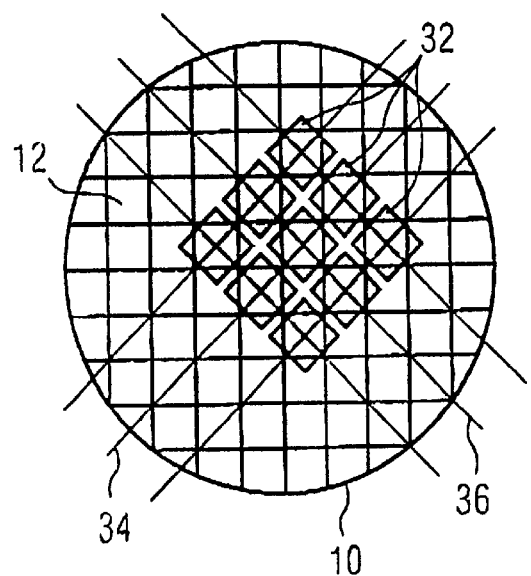

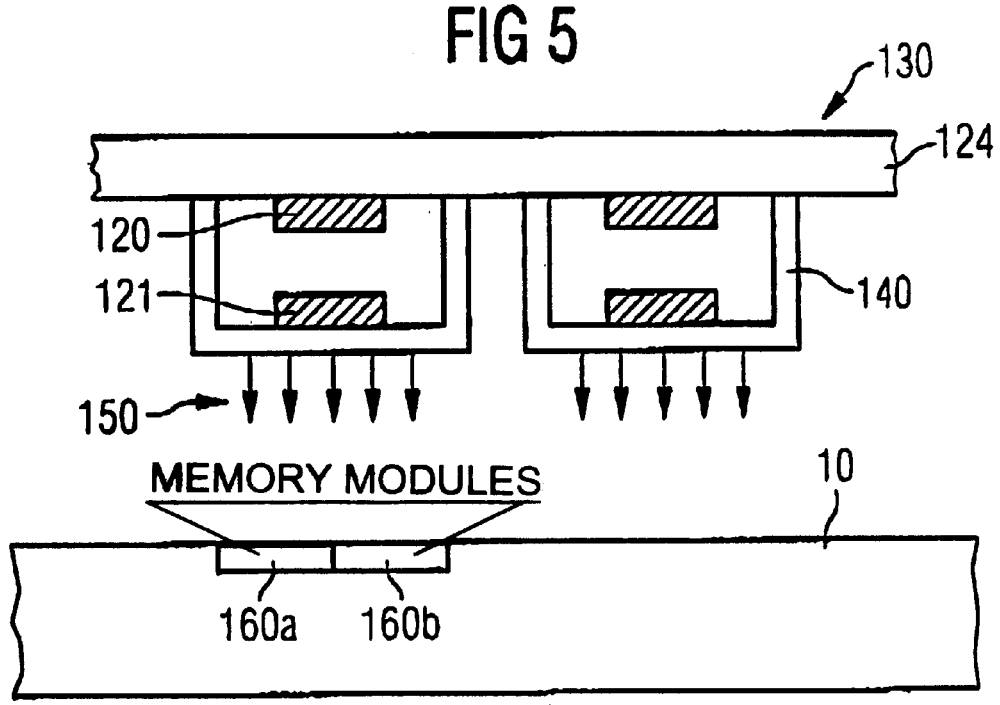
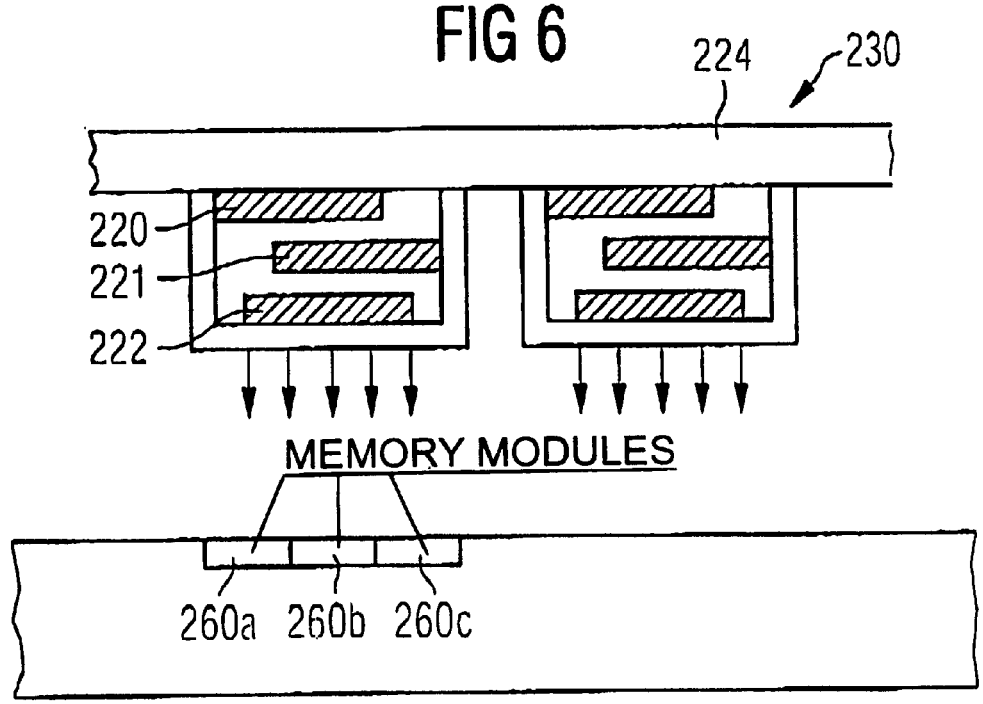

US 6,762,611 B2

TEST CONFIGURATION AND TEST METHOD FOR TESTING A PLURALITY OF INTEGRATED CIRCUITS IN PARALLEL

BACKGROUND OF THE INVENTION

FIELD OF THE INVENTION

The present invention relates to a probe card configuration for testing a plurality of integrated circuits, in particular fast semiconductor memory components located on a wafer, in parallel. The probe card configuration has a carrier board for bringing up electric signal lines from a test system and has contact-making needles for producing electrical connections with contact areas on the circuits to be tested.

Current DRAM (Dynamic Random Access Memory) chips are tested with expensive memory test systems. Test programs for checking the functional suitability of the memory chips are used on these testers. In this case, signals with exactly defined voltage levels are applied to the semiconductor circuits to be tested at exactly defined times. During the checking of the read function of the DUT (Device Under Test), it is also possible to read signals coming into the test instrument from the DUT at precisely defined times and to compare them with expected signal values.

Because of the high frequencies at which current memory modules operate, for example 200 to 300 MHz in the case of DDR (Double Data Rate) DRAMs and 400 to 800 MHz in the case of Rambus DRAMs, the these chips specify highly accurate signals. For example, in the case of DDR memories, signal specifications of the order of magnitude of 500 ps are common. The production or memory test systems that are used therefore have to meet extremely high technical requirements, which leads to correspondingly high production and testing costs. At present, DRAM test instruments that meet the aforementioned conditions cost several millions of dollars each. All of this causes the testing costs to be up to 30% of the production costs in the case of the highest frequency memory modules.

Functional testing of the memory modules is carried out both at the wafer level, and following separation, at the module level. Nowadays, at the wafer level, the basic function of the memory chip is usually checked in relatively low frequency range of about 10 to 100 MHz. The higher-frequency tests are then carried out following mounting in the encapsulated state, on specific module testers.

In principle, it would be desirable to carry out a high-speed test on the memory components as early as at the wafer level, since then the functional test is carried out at a time which is beneficial from the value creation point of view, so that there is a great potential for cost savings.

However, high-frequency tests at the wafer level are possible only to a limited extent at present, which is mainly attributable to the large geometric dimensions of the test configuration. From the pin electronics of the tester as far as the components to be tested via the test head, the probe card configuration has to bridge dimensions in the order of magnitude of 10 cm to 1 m. This is virtually impossible with adequate accuracy and with high parallelism at frequencies of 200 MHz to 1 GHz.

U.S. Pat. No. 6,064,213 discloses a probe card configuration. Published German Patent application DE 198 26 314 A1 discloses an arrangement for testing a plurality of integrated circuits in parallel. The arrangement has a carrier board to bring up electrical signal lines of a test system and has a plurality of mounts to accommodate the integrated circuits to be tested. This is where the invention begins.

SUMMARY OF THE INVENTION

It is accordingly an object of the invention to provide a probe card configuration for testing a plurality of integrated circuits on a wafer in parallel and a method of using the probe card configuration to test the plurality of the integrated circuits on the wafer which overcome the above-mentioned disadvantages of the prior art apparatus and methods of this general type.

With the foregoing and other objects in view there is provided, in accordance with the invention, a probe card configuration for testing a plurality of integrated circuits in parallel using a test system. The probe card configuration includes a carrier board for receiving electrical signal lines of the test system. The carrier board defines a plane. The probe card configuration includes contact-making needles for producing electrical connections with contact areas on the integrated circuits to be tested. The contact-making needles are for connecting to the electrical signal lines of the test system to produce signal paths between the test system and the integrated circuits to be tested. The probe card configuration also includes a plurality of active modules configured on the carrier board. Each one of the plurality of the active modules is assigned to one of the integrated circuits to be tested in parallel. Each one of the plurality of the active modules is inserted into ones of the signal paths that are between the test system and the assigned one of the integrated circuits to be tested. The plurality of the active modules are configured at least partly overlapping in a direction at right angles to the plane of the carrier board.

In accordance with an added feature of the invention, each one of the plurality of the integrated circuits has a longest extent; each one of the plurality of the active modules has a longest extent; and the longest extent of each one of the plurality of the active modules is greater than the longest extent of the assigned one of the integrated circuits to be tested.

With the foregoing and other objects in view there is provided, in accordance with the invention, a probe card configuration for testing a plurality of integrated circuits in parallel using a test system. The probe card configuration includes a carrier board for receiving electrical signal lines of the test system. The carrier board defines a plane. The probe card configuration includes contact-making needles for producing electrical connections with contact areas on the integrated circuits to be tested. The contact-making needles are for connection with the electrical signal lines of the test system to produce signal paths between the test system and the integrated circuits to be tested. The probe card configuration also includes a plurality of active modules configured on the carrier board. Each one of the plurality of the active modules is assigned to one of the integrated circuits to be tested in parallel. Each one of the plurality of the active modules is inserted into ones of the signal paths that are between the test system and the respective assigned one of the integrated circuits to be tested. Each one of the plurality of the active modules has a longest extent. The longest extent of each one of the plurality of the active modules is configured non-parallel with the plane of the carrier board.

In accordance with an additional feature of the invention, the longest extent of each one of the plurality of the active modules is configured at right angles with respect to the plane of the carrier board.

With the foregoing and other objects in view there is provided, in accordance with the invention, a method for the testing a plurality of integrated circuits on a wafer in parallel, which includes steps of: providing the probe card configuration according to one of the above described embodiments; making contact between a first group of the integrated circuits to be tested on the wafer and the contact-making needles; performing a test routine with the first group of the integrated circuits to be tested; making contact between a second group of the integrated circuits to be tested on the wafer and the contact-making needles, the second group of the integrated circuits being located disjunct with respect to the first group of the integrated circuits; performing a test routine with the second group of the integrated circuits to be tested; configuring the integrated circuits to be tested on the wafer in a regular rectangular grid form having main directions at right angles to one another; configuring the first group of the integrated circuits and the second group of the integrated circuits to extend along the main directions of the grid; performing the step of making contact between the first group of the integrated circuits and the contact-making needles such that a given one of the integrated circuits is located between two of the integrated circuits of the first group in one of the main directions, and the given one of the integrated circuits is not tested in parallel with the first group of the integrated circuits; and performing the step of making contact between the second group of the integrated circuits and the contact-making needles such that another given one of the integrated circuits is located between two of the integrated circuits of the second group in one of the main directions, and the other given one of the integrated circuits is not tested in parallel with the second group of the integrated circuits. As a result, a minimum number of testing operations is needed in order to test all the circuits on a wafer.

With the foregoing and other objects in view there is also provided, in accordance with the invention, a method for testing a plurality of integrated circuits on a wafer in parallel, which includes steps of: providing the probe card configuration according to one of the above described embodiments; making contact between a first group of the integrated circuits to be tested on the wafer and the contact-making needles; performing a test routine with the first group of the integrated circuits to be tested; making contact between a second group of the integrated circuits to be tested on the wafer and the contact-making needles, the second group of the integrated circuits being located disjunct with respect to the first group of the integrated circuits; performing a test routine with the second group of the integrated circuits to be tested; configuring the integrated circuits to be tested on the wafer in a regular rectangular grid form having diagonals; and configuring the first group of the integrated circuits and the second group of the integrated circuits to extend along the diagonals of the grid.

With the foregoing and other objects in view there is also provided, in accordance with the invention, a configuration for testing a plurality of integrated circuits in parallel. The configuration includes a test system having electrical signal lines and a carrier board receiving the electrical signal lines of the test system. The carrier board defines a plane. The configuration includes a plurality of mounts for accommodating the plurality of the modules to be tested. The plurality of the mounts receive the electrical signal lines of the test system. The plurality of the mounts are connected to the electrical signal lines of the test system for producing signal paths between the test system and the modules to be tested. The configuration includes a plurality of active modules configured on the carrier board. Each one of the plurality of the active modules are assigned to one of the modules to be tested in parallel. Each one of the plurality of the active modules are inserted into ones of the signal paths that are between the test system and the assigned one of the modules to be tested. The plurality of the active modules are configured to at least partly overlap in a direction at right angles to the plane of the carrier board.

According to the invention, a generic probe card configuration is provided for testing a plurality of integrated circuits on a wafer in parallel. The probe card configuration includes a plurality of active modules that are arranged on a carrier board, are each assigned to one of the circuits to be tested in parallel, and are each inserted into the signal path between the test system and the associated circuit to be tested.

By means of the active modules, for example low frequency test signals from a relatively slow test system can be actively transformed into high-frequency test signals for high-speed tests on the modules to be tested. In general, the active modules permit lower requirements to be placed on the intelligence and/or the speed of the test system, since such functions can be performed by the active modules belonging to the probe card configuration.

It is preferable for the active modules to be arranged at least partly overlapping, based on a direction perpendicular to the plane of the carrier board. This has the advantage that, even in the case of relatively large dimensions of the active modules, the area effectively needed per active module remains small. In particular, even circuits arranged beside one another on the wafer can also be tested in parallel if the active modules have a larger dimension than the circuits to be tested. In this case, in particular, in edge regions of the configuration, it is often not necessary for all of the active modules to be arranged overlapping.

Alternatively, the active modules are arranged, at least partly, with their longest extent not in parallel, but preferably at right angles to the plane of the carrier board. This also achieves the situation where the active modules need a smaller effective area on the probe card configuration.

Other features which are considered as characteristic for the invention are set forth in the appended claims.

Although the invention is illustrated and described herein as embodied in a test configuration and test method for the parallel testing of a plurality of integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

The invention is to be explained in more detail below using an exemplary embodiment in conjunction with the drawings. In each case, only the elements essential to an understanding of the invention are illustrated. In this case:

BRIEF DESCRIPTION OF THE DRAWINGS

FIG. 3 schematically shows an embodiment of a probe card configuration;

FIG. 4a schematically shows a plan view of a wafer with circuits tested in parallel in a first manner;

FIG. 4b schematically shows a plan view of a wafer with circuits tested in parallel in a second manner;

FIG. 5 schematically shows a further embodiment of the probe card configuration;

FIG. 6 schematically shows a further embodiment of the probe card configuration;

DESCRIPTION OF THE PREFERRED EMBODIMENTS

Figure 1:
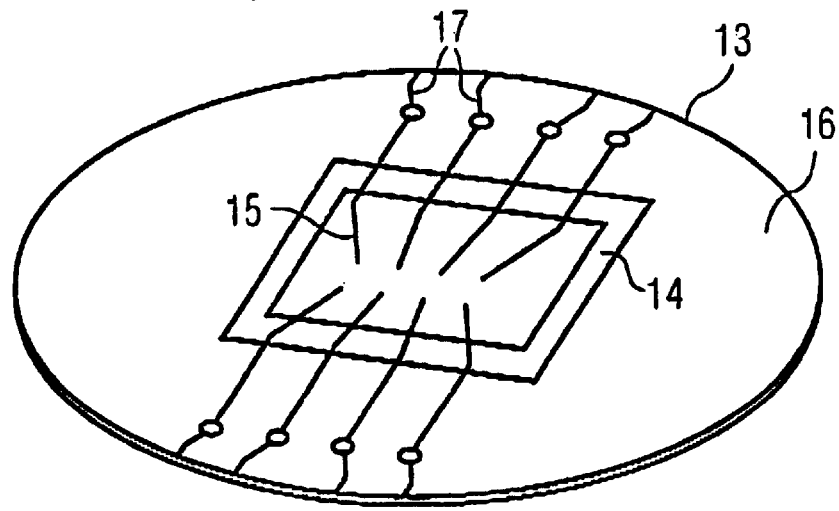
FIG. 1 schematically shows a prior art probe card configuration.

Referring now to the figures of the drawing in detail and first, particularly, to FIG. 1 thereof, there is shown a schematic representation of a prior art probe card 13. The probe card 13 includes a ceramic carrier 14 that is fixed to a printed circuit board configuration 16. Contact needles 15 are precisely mounted on the ceramic carrier 14. The interwiring 17 of the individual contact needles 15 to a test system (not shown) is also carried out on the printed circuit board configuration 16. Such conventional probe card configurations have only electrical connections and passive components, such as relays, resistors, and capacitors.

Figure 2:
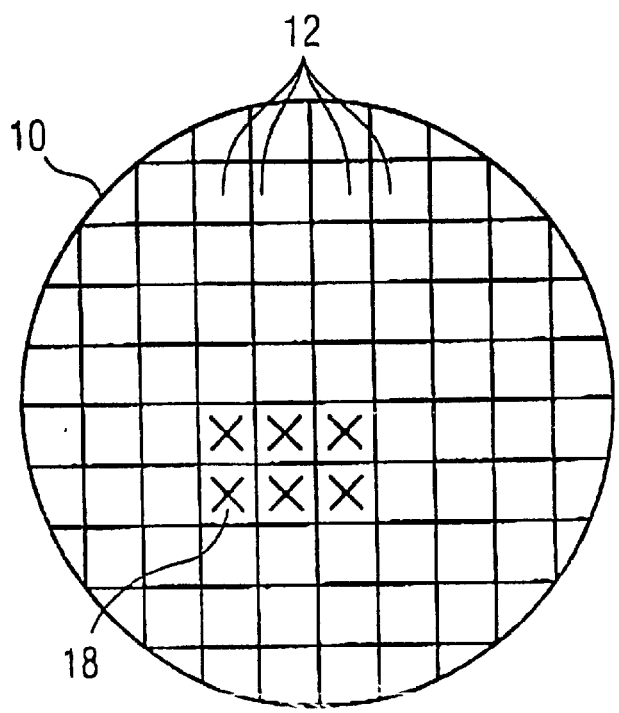
FIG. 2 schematically shows a plan view of a wafer with circuits that are tested in parallel.

Here, the contact needles 15 are generally arranged in such a way that a maximum number of chips or modules 12 on a wafer 10 can be tested in parallel. This maximum number is normally limited by the number and by the length of the needles 15 that can be integrated on the ceramic carrier 14. Therefore, the chips 18 to be tested simultaneously are usually arranged immediately adjacent and in a rectangle, as indicated by crosses in FIG. 2. Such a configuration is optimal in order to test all of the chips 12 on the wafer 10 with a minimum number of probe card touchdowns.

FIG. 3 shows a schematic representation of one exemplary embodiment of the present invention. The probe card configuration 30 has a large number of BOST (Build Outside Self Test) modules 20 arranged on a carrier board 24, for example a ceramic carrier board 24. Each BOST module 20 is in this case an ASIC (Application Specific Integrated Circuit) semiconductor circuit, which uses the relatively slow, low-frequency test signals from the test instrument 40 to actively generate high-frequency test signals for high-speed tests on the memory module to be tested. In practice, there is a further printed circuit board (not shown), on which the signal lines are unbraided and shielded with respect to one another. This further printed circuit board is located between the test system 40 and the carrier board 24.

The stepped-up high-frequency test signals are transmitted via the contact needles 22 to corresponding contact areas 27 on the memory modules 26a–26f to be tested on a wafer 10. As FIG. 3 shows, the BOST module 20 can have greater dimensions than the memory modules to be tested. Then, for example, only every second memory module is tested in parallel, that is to say in FIG. 3 first, the group of memory modules 26a, 26c and 26e is tested. After a test program has been carried out, the wafer 10 and the probe card 30 are displaced relative to each other, so that in a next test group, the memory modules 26b, 26d and 26f are tested.

The detailed test sequence depends on the form and size of the active modules and the form and size of the circuits to be tested on the wafer. As an example, two examples will be illustrated:

FIG. 4(a) indicates the test sequence for rectangular BOST modules. The size of the BOST modules 20 is illustrated by rectangles on the wafer 10 with the memory modules 12. Since the dimensions of the BOST modules are greater in the y direction than those of the memory modules 12, in this direction simultaneous contact can only be made with every second memory module 28. In the x direction, the dimension of the BOST modules is small enough to be able to cover adjacent memory modules. The test sequence which results in FIG. 4(a) is therefore, first the parallel testing of some of the memory modules 28. Then, the wafer is displaced in the y direction by the size of one memory module, and the test of the next group of memory modules is carried out. The result overall is gap-free testing of all memory modules 12.

Another situation is represented in FIG. 4(b). There, the BOST modules are greater in two dimensions than the memory modules 12. By means of rotating the probe card through 45° with respect to the wafer, 3×3 diagonally adjacent memory modules 32 are tested simultaneously. The memory modules lying between the tested modules can be covered after the wafer has been displaced in the x direction by the size of one memory module. As a result, a minimum number of touchdowns is necessary in order to cover the entire wafer 10. It goes without saying that the number of modules tested in FIGS. 4(a) and 4(b) has been restricted to 2×3 and 3×3, respectively, only for reasons of simplicity. In practice, n×m modules are tested in parallel, where n, m≧1, and n and m are advantageously made as large as technically possible.

Using the probe card configuration 130 shown in FIG. 5, it is possible, in spite of the greater geometric dimensions of the BOST chips 120, 121 as compared with the memory modules 160a, 160b to be tested, to test adjacent memory modules simultaneously as well. For this purpose, the probe card configuration 130 is provided with a ceramic carrier 140, on which the contact needles 150 are fitted. Within the interspace formed by the ceramic carrier 140 and the carrier board 124, two BOST chips 120, 121 can be arranged overlapping vertically. The effective area required by the BOST chips can consequently be reduced by up to a factor 2, given complete overlapping, so that the adjacent memory modules 160a, 160b can be tested in parallel.

Even higher overlaps, for example of three BOST modules 220, 221, 222, are in principle possible, as illustrated by the probe card configuration 230 of FIG. 6.

Figure 7:
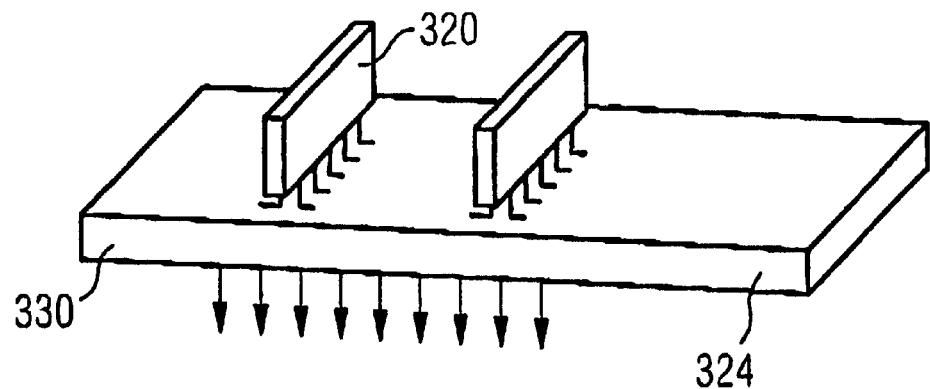
FIG. 7 schematically shows a further embodiment of the probe card configuration.

A comparable effect may be achieved by non-horizontal mounting of the BOST modules. FIG. 7 shows a probe card configuration 330 in which the BOST modules 320 are mounted on the carrier board 324 in a vertical housing. The space required by each BOST module 320 on the carrier board 324 decreases appropriately.

Figure 8:
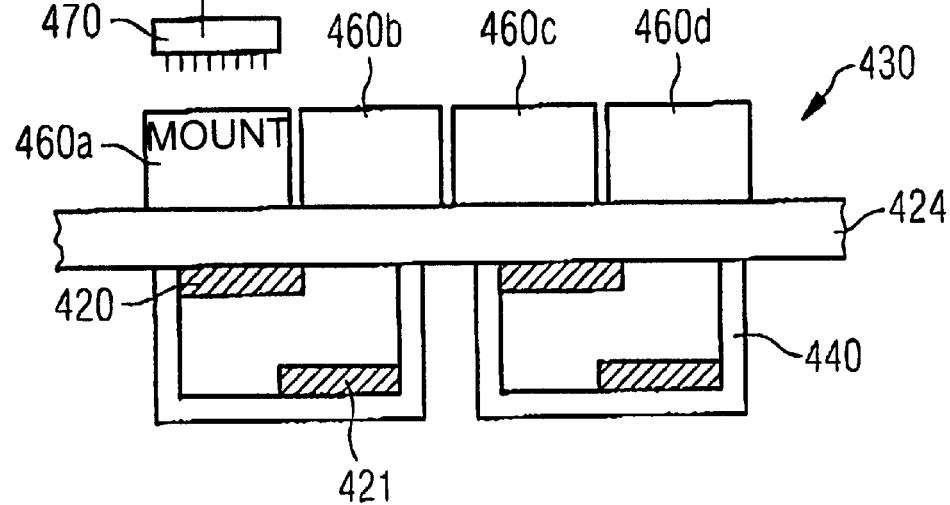
FIG. 8 schematically shows a further embodiment of the probe card configuration.

FIG. 8 shows a configuration 430 for the parallel testing of a large number of modules based on the principle of the probe card configuration shown in FIG. 5. The BOST chips 420, 421 are fitted overlapping vertically underneath a carrier board 424, in a carrier 440 or directly on the carrier board 424. Instead of contact-making needles, a row of mounts 460a–460d for accommodating the modules 470 to be tested is provided on the top surface of the carrier board 424. Even for tests at the module level, the intelligence and/or the speed in such a configuration may be relocated from the test system to the active modules, such as the BOST chips 420, 421, even in the case in which the dimensions of the BOST chips exceed the size of the mounts.

We claim:

1. A probe card configuration for testing a plurality of integrated circuits in parallel, the probe card configuration comprising:

a test system having electrical signal lines;

a carrier board for receiving said electrical signal lines of said test system, said carrier board defining a plane;

a carrier mounted to said carrier board forming an interspace between said carrier and said carrier board;

contact-making needles for producing electrical connections with contact areas on the integrate circuits to be tested, said contact-making needles for connection to said electrical signal lines of said test system to produce signal paths between said test system and the integrated circuits to be tested, said contact-making needle being disposed on said carrier; and a plurality of active modules configured on said carrier board, each one of said plurality of said active modules being assigned to one of the integrated circuits to be tested in parallel, each one of said plurality of said active modules being inserted into ones of the signal paths that are between said test system and the assigned one of the integrated circuits to be tested;

at least two of said plurality of said active modules being disposed within said interspace overlapping each other vertically, at least one of said plurality of said active modules being disposed on said carrier.

2. The probe card configuration according to claim 1, in combination with the plurality of the integrated circuits, wherein:

the plurality of the integrated circuits are a plurality of fast semiconductor memory modules that are located on a wafer.

3. The probe card configuration according to claim 1, in combination with the plurality of the integrated circuits, wherein:

each one of the plurality of the integrated circuits has a longest extent;

each one of said plurality of said active modules has a longest extent; and said longest extent of each one of said plurality of said active modules is greater than the longest extent of the assigned one of the integrated circuits to be tested.

4. A configuration for testing a plurality of integrated circuits in parallel, comprising:

a test system having electrical signal lines;

a carrier board receiving said electrical signal lines of said test system, said carrier board defining a plane;

a carrier mounted to said carrier board forming an interspace between said carrier and said carrier board;

a plurality of mounts for accommodating the plurality of the modules to be tested, said plurality of said mounts receiving said electrical signal lines of said test system, said plurality of said mounts connected to said electrical signal lines of said test system for producing signal paths between said test system and the modules to be tested; and a plurality of active modules configured on said carrier board, each one of said plurality of said active modules being assigned to one of the modules to be tested in parallel, each one of said plurality of said active modules being inserted into ones of the signal paths that are between said test system and the assigned one of the modules to be tested;

at least two of said plurality of said active modules being disposed within said interspace overlapping each other vertically, at least one of said plurality of said active modules being disposed on said carrier.

5. The probe card configuration according to claim 4, in combination with the plurality of the integrated circuits, wherein:

the plurality of the integrated circuits are a plurality of fast semiconductor memory modules that are located on a wafer.

6. The probe card configuration according to claim 1, wherein said carrier is a ceramic carrier.

7. A method for testing a plurality of integrated circuits on a wafer in parallel, which comprises:

providing the probe card configuration according to claim 1;

making contact between a first group of the integrated circuits to be tested on the wafer and said contact-making needles;

performing a test routine with the first group of the integrated circuits to be tested;

making contact between a second group of the integrated circuits to be tested on the wafer and said contact-making needles, the second group of the integrated circuits being located disjunct with respect to the first group of the integrated circuits;

performing a test routine with the second group of the integrated circuits to be tested;

configuring the integrated circuits to be tested on the wafer in a regular rectangular grid form having main directions at right angles to one another;

configuring the first group of the integrated circuits and the second group of the integrated circuits to extend along the main directions of the grid;

performing the step of making contact between the first group of the integrated circuits and said contact-making needles such that a given one of the integrated circuits is located between two of the integrated circuits of the first group in one of the main directions, and the given one of the integrated circuits is not tested in parallel with the first group of the integrated circuits; and performing the step of making contact between the second group of the integrated circuits and said contact-making needles such that another given one of the integrated circuits is located between two of the integrated circuits of the second group in one of the main directions, and the other given one of the integrated circuits is not tested in parallel with the second group of the integrated circuits.

8. A method for testing a plurality of integrated circuits on a wafer in parallel, which comprises:

providing the probe card configuration according to claim 1;

making contact between a first group of the integrated circuits to be tested on the wafer and said contact-making needles;

performing a test routine with the first group of the integrated circuits to be tested;

making contact between a second group of the integrated circuits to be tested on the wafer and said contact-making needles, the second group of the integrated circuits being located disjunct with respect to the first group of the integrated circuits;

performing a test routine with the second group of the integrated circuits to be tested;

configuring the integrated circuits to be tested on the wafer in a regular rectangular grid form having diagonals;

configuring the first group of the integrated circuits and the second group of the integrated circuits to extend along the diagonals of the grid.

* * * * *